United States Patent
Ho et al.

(10) Patent No.: US 7,796,436 B2
(45) Date of Patent: Sep. 14, 2010

(54) READING METHOD FOR MLC MEMORY AND READING CIRCUIT USING THE SAME

(75) Inventors: Hsin-Yi Ho, Hsinchu (TW); Ji-Yu Hung, Miaoli County (TW)

(73) Assignee: Macronix International Co., Ltd., Hsinchu (TW)

(*) Notice: Subject to any disclaimer, the term of this patent is extended or adjusted under 35 U.S.C. 154(b) by 103 days.

(21) Appl. No.: 12/167,265

(22) Filed: Jul. 3, 2008

(65) Prior Publication Data

US 2010/0002505 A1 Jan. 7, 2010

(51) Int. Cl.
*G11C 16/06* (2006.01)
*G11C 16/04* (2006.01)

(52) U.S. Cl. .................... 365/185.21; 365/185.02; 365/185.03

(58) Field of Classification Search ............. 365/185.21
See application file for complete search history.

(56) References Cited

U.S. PATENT DOCUMENTS

| 6,009,015 A * | 12/1999 | Sugiyama | 365/185.22 |
| 6,631,088 B2 * | 10/2003 | Ogura et al. | 365/185.18 |
| 2005/0179078 A1 * | 8/2005 | Lee | 257/314 |
| 2009/0129157 A1 * | 5/2009 | Honda et al. | 365/185.03 |
| 2009/0180320 A1 * | 7/2009 | Torii et al. | 365/185.05 |

* cited by examiner

*Primary Examiner*—Son L Mai
(74) *Attorney, Agent, or Firm*—:Thomas, Kayden, Horstemeyer & Risley, LLP

(57) ABSTRACT

A reading method for a multi-level cell (MLC) memory includes the following steps. A number of word line voltages are sequentially provided to an MLC memory cell. A number of bit line voltages corresponding to the word line voltages are sequentially provided to the MLC memory cell. One of the word line voltages is higher than another one of the word line voltages, and one of the bit line voltages corresponding to the one of the word line voltages is lower than another one of the bit line voltages corresponding to the another one of the word line voltages.

4 Claims, 5 Drawing Sheets

READING METHOD FOR MLC MEMORY AND READING CIRCUIT USING THE SAME

BACKGROUND OF THE INVENTION

1. Field of the Invention

The invention relates in general to a reading method and a reading circuit, and more particularly to a reading method for a multi-level cell (MLC) memory and a reading circuit using the same.

2. Description of the Related Art

Non-volatile memories are widely used in various products, such as mobile phones, digital cameras and personal digital assistants (PDAs). The non-volatile memories may be classified into various kinds, one of which is the multi-level cell memory that is frequently seen.

FIG. 1 is a structure diagram showing a conventional MLC memory cell 100. Referring to FIG. 1, the MLC memory cell 100 includes a left half cell 110 and a right half cell 120. Each half cell can trap charges, and the amount of trapped charges influences the threshold voltage states of each half cell so that the object of storing data can be achieved. That is, the data content stored in each half cell can be obtained according to the threshold voltage states of each half cell. Furthermore, in an MLC memory having many MLC memory cells 100, the threshold voltages of the MLC memory cells 100 are not completely the same even if the same data is stored in the MLC memory cells 100 because the physical properties of the MLC memory cells 100 are not completely the same. So, the states of each half cell are represented by the threshold voltage distribution.

FIG. 2 is a schematic illustration showing one example of threshold voltage distribution of the MLC memory. As shown in the example of FIG. 2, it is assumed that each half cell can store 2 bits of data. Thus, the threshold voltage distribution of the MLC memory having a number of MLC memory cells 100 has four threshold voltage states {11, 10, 00, 01}. Taking the threshold voltage state {11} corresponding to the left half cell as an example, the threshold voltage state {11} represents that the threshold voltage value of the left half cell ranges between 2.0 to 3.1 volts. The threshold voltage state {11} represents that the data value stored in the left half cell is "11".

Conventionally, when the reading operation is being performed, different word line voltages are applied to a gate G of the MLC memory cell 100, corresponding bit line voltages are applied to the source or drain of the MLC memory cell 100, and the data value stored in the MLC memory cell 100 is judged according to the value of the current flowing through the source S. As shown in FIG. 2, when the data of the MLC memory cell is read, the used word line voltage is at least one of the word line voltages VG1 to VG3. For example, the level of the word line voltage VG1 ranges between the threshold voltage states {01} and {00}, that is, ranges between 4.7 and 5.5 volts.

When the MLC memory cell is being read, a subsequent read error may be caused due to read disturb. FIG. 3 is a schematic illustration showing the conventional MLC memory cell 100 encountering the read disturb. Referring to FIGS. 3 and 2, the charges stored in the right half cell 120 are influenced when the MLC memory cell 100 is being read. That is, the operation of reading the left half cell 110 influences the threshold voltage value of the right half cell 120 because the word line voltage VG and the bit line voltage VBL used to read the left half cell 110 approach the word line voltage VG and the bit line voltage VBL used to program the right half cell 120.

More particularly, when the threshold voltage of the left half cell 110 pertains to the threshold voltage state {01} and the threshold voltage of the right half cell 120 pertains to the threshold voltage state {11} and when the left half cell 110 is being read, the right half cell 120 is influenced most seriously. Therefore, the problem of the read error may occur if the data stored in the right half cell 120 is to be read after the left half cell 110 is read.

Thus, it is an important subject in the industry to avoid the above-mentioned read disturb, to avoid the problem of the stored data error caused by the threshold voltage values of the neighboring half cells, and to increase the correctness of reading the MLC memory.

SUMMARY OF THE INVENTION

The invention is directed to a reading method for an MLC memory and a reading circuit using the same, which can reduce the possibility of occurrence of read disturb in order to ease the phenomenon of the read error of the MLC memory and to enhance the read correctness.

According to a first aspect of the present invention, a reading method for a multi-level cell (MLC) memory is provided. The method includes the following steps. A number of word line voltages are sequentially provided. A number of bit line voltages corresponding to the word line voltages are sequentially provided. If one of the word line voltages is higher than another one of the word line voltages, one of the bit line voltages corresponding to the one of the word line voltages is lower than another one of the bit line voltages corresponding to the another one of the word line voltages.

According to a second aspect of the present invention, a reading circuit applied to a multi-level cell (MLC) memory is provided. The circuit includes a word line voltage controller and a bit line voltage controller. The word line voltage controller provides a number of word line voltages. The bit line voltage controller provides a number of bit line voltages corresponding to the word line voltages. If one of the word line voltages is higher than another one of the word line voltages, one of the bit line voltages corresponding to the one of the word line voltages is lower than another one of the bit line voltages corresponding to the another one of the word line voltages.

The invention will become apparent from the following detailed description of the preferred but non-limiting embodiments. The following description is made with reference to the accompanying drawings.

DETAILED DESCRIPTION OF THE INVENTION

First Embodiment

Figure 4:
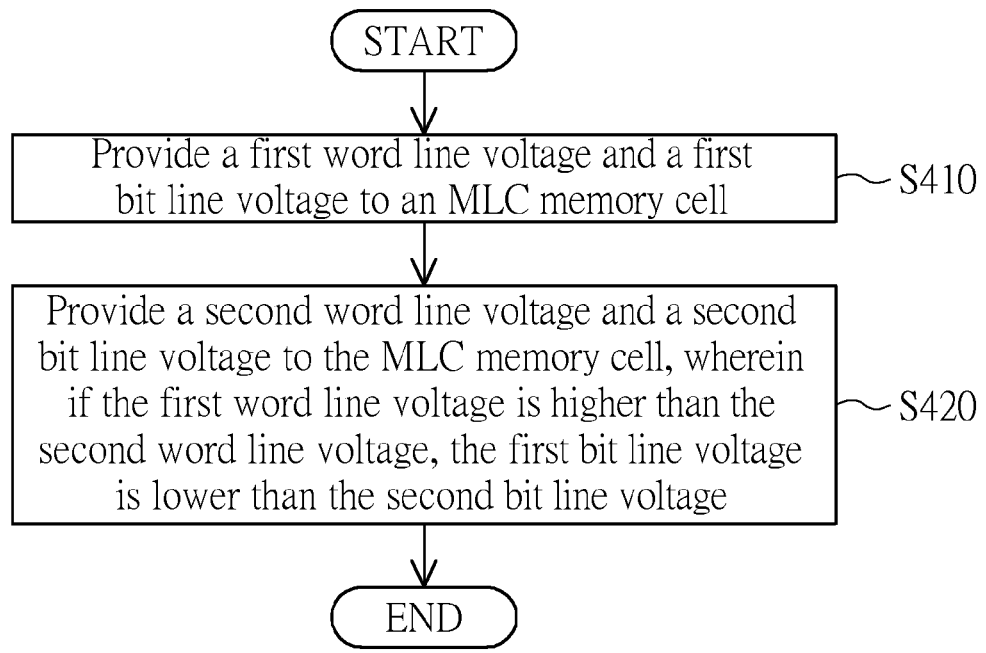
FIG. 4 is a flow chart showing a reading method for an MLC memory according to a first embodiment of the invention.

FIG. 4 is a flow chart showing a reading method for an MLC memory according to a first embodiment of the invention. The method includes the following steps. In step S410, a first word line voltage and a first bit line voltage are provided to an MLC memory cell. In step S420, a second word line voltage and a second bit line voltage are provided to the MLC memory cell, wherein if the first word line voltage is higher than the second word line voltage, the first bit line voltage is lower than the second bit line voltage.

Figure 5:
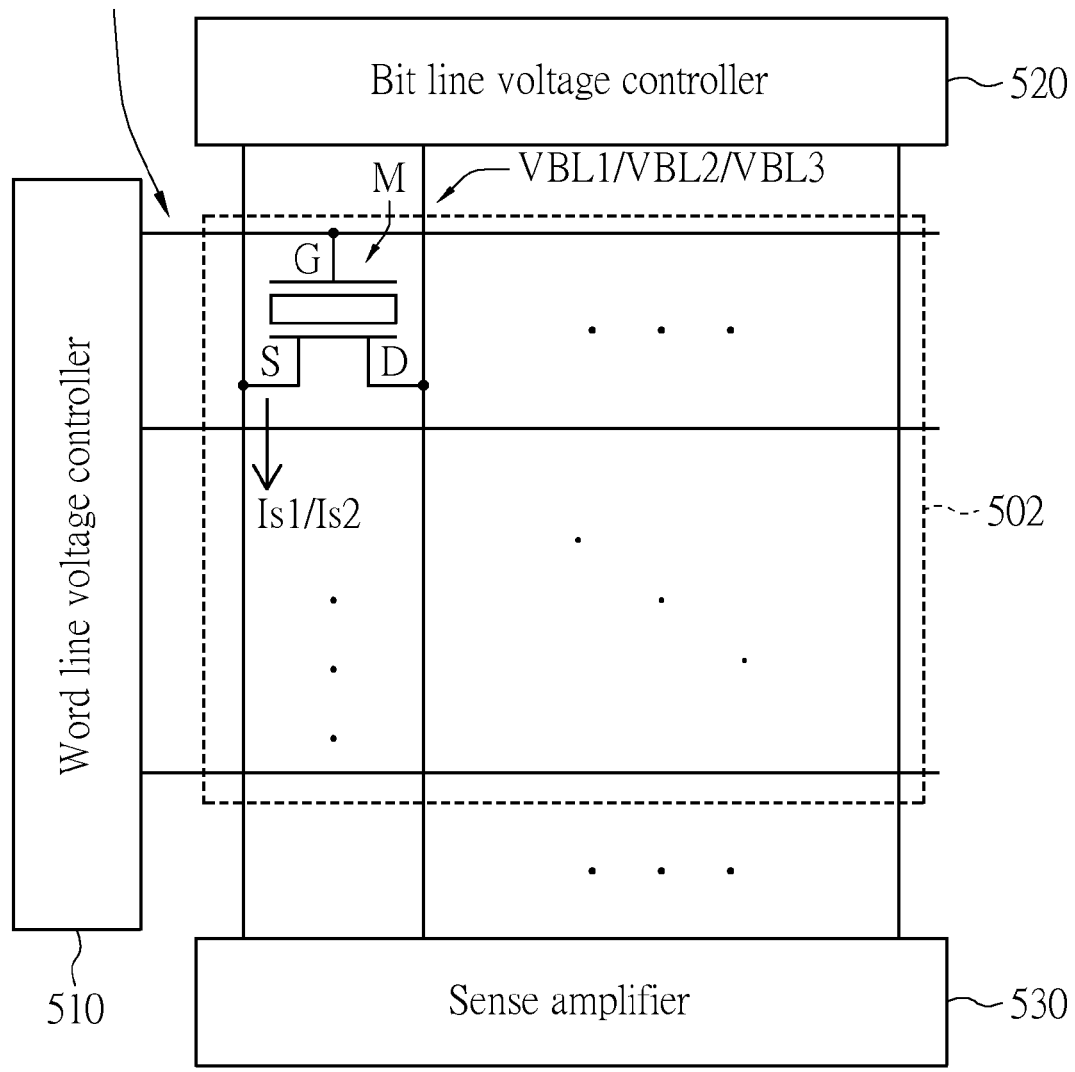
FIG. 5 is a schematic illustration showing a reading circuit using the reading method for the MLC memory according to the first embodiment of the invention.

FIG. 5 is a schematic illustration showing a reading circuit 500 using the reading method for the MLC memory according to the first embodiment of the invention. Referring to FIG. 5, the reading circuit 500 includes a word line voltage controller 510, a bit line voltage controller 520 and a sense amplifier 530. In FIG. 5, the function and the operation method of each element are described by taking an MLC memory cell M of an MLC memory 502 as an example.

The word line voltage controller 510 provides a word line voltage VG1 or a word line voltage VG2 to the MLC memory cell M. The bit line voltage controller 520 correspondingly provides a bit line voltage VBL1 or a bit line voltage VBL2 to the MLC memory cell M. The word line voltage VG1 and the bit line voltage VBL1 are provided simultaneously, and the word line voltage VG2 and the bit line voltage VBL2 are provided simultaneously. If the word line voltage VG1 is higher than the word line voltage VG2, the bit line voltage VBL1 is lower than the bit line voltage VBL2.

That is, when the level of the word line voltage provided by the word line voltage controller 510 is changed (e.g., increased from the word line voltage VG2 to the word line voltage VG1 (VG2<VG1)), the bit line voltage provided by the bit line voltage controller 520 is correspondingly changed (i.e., decreased from the bit line voltage VBL2 to the bit line voltage VBL1(VBL2>VBL1)).

The sense amplifier 530 detects the current Is1 flowing through the MLC memory cell M when the word line voltage VG1 and the bit line voltage VBL1 are provided to the MLC memory cell M. The sense amplifier 530 further detects the current Is2 flowing through the MLC memory cell M when the word line voltage VG2 and the bit line voltage VBL2 are provided to the MLC memory cell M. The sense amplifier 530 further determines the data value stored in the MLC memory cell M according to the values of the current Is1 and the current Is2. In practice, the word line voltage is applied to the gate G of the MLC memory cell M, the corresponding bit line voltage is applied to the drain D of the MLC memory cell M, and the current flows through the source S of the MLC memory cell M.

In addition, the word line voltage controller 510 of this embodiment further provides a word line voltage VG3 to the MLC memory cell M, and the bit line voltage controller 520 further correspondingly provides a bit line voltage VBL3 to the MLC memory cell M. If the word line voltage VG2 is higher than the word line voltage VG3, the bit line voltage VBL2 is lower than the bit line voltage VBL3. That is, VBL3>VBL2>VBL1 if VG3<VG2<VG1.

Figure 1:
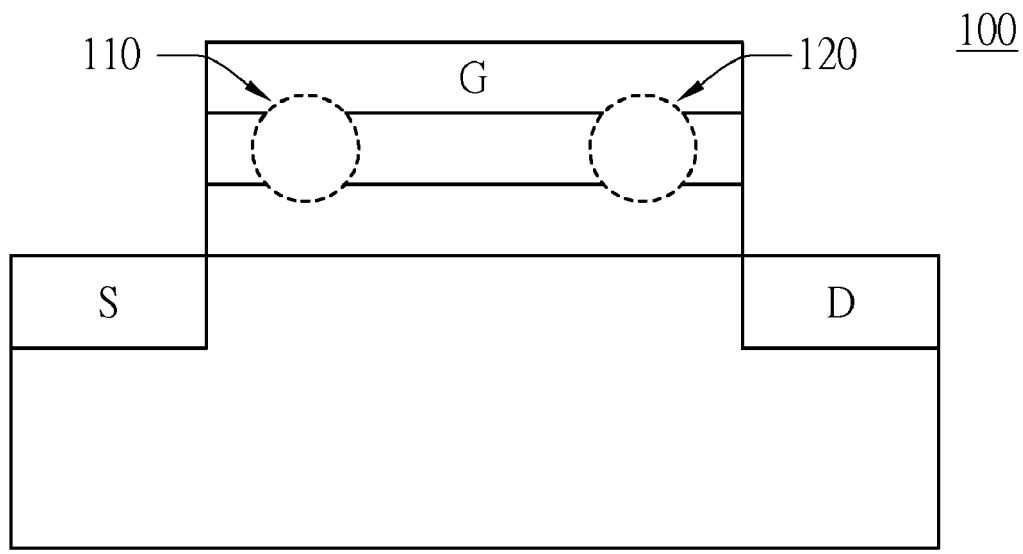
FIG. 1 (Prior Art) is a structure diagram showing a conventional MLC memory cell.
Figure 2:
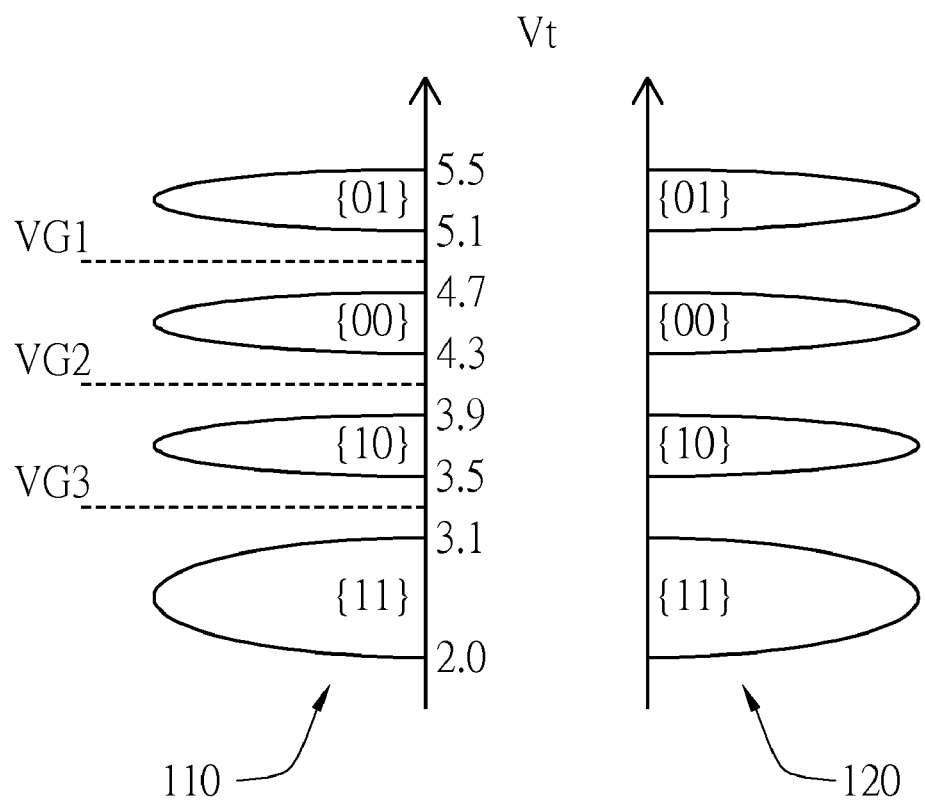
FIG. 2 (Prior Art) is a schematic illustration showing one example of threshold voltage distribution of an MLC memory.
Figure 3:
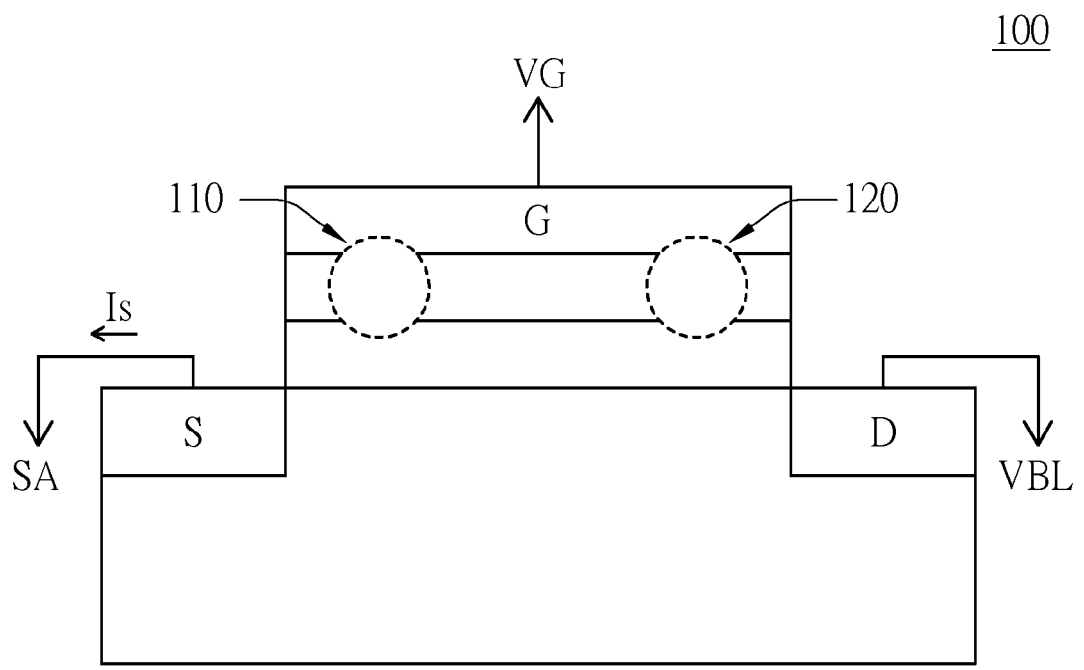
FIG. 3 (Prior Art) is a schematic illustration for explaining the conventional MLC memory cell encountering read disturb.
Figure 6:
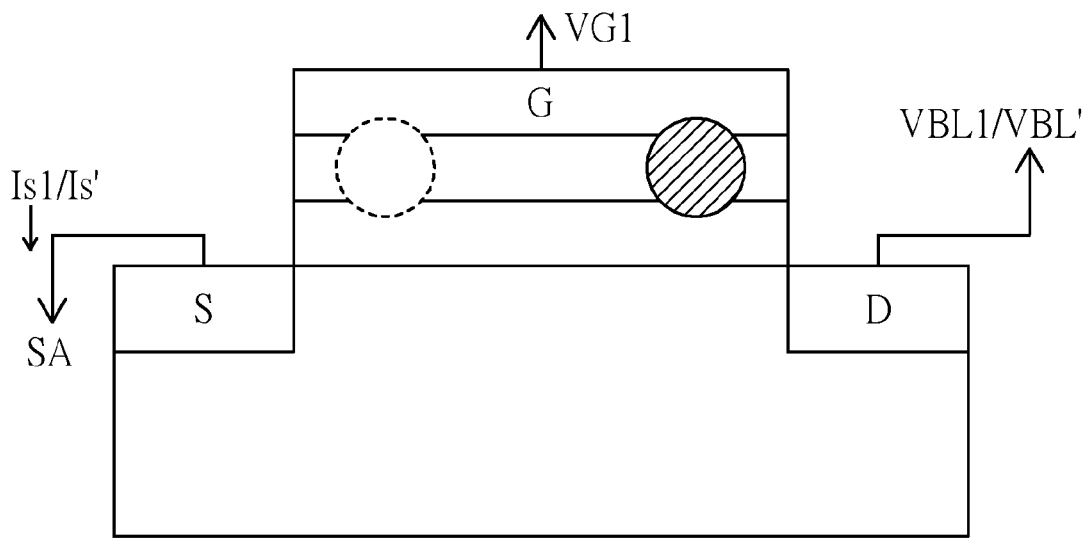
FIG. 6 is a schematic illustration showing an example when the MLC memory cell is being read.

How the phenomenon of read disturb is eased in this embodiment will be described in the following. FIG. 6 is a schematic illustration showing an example when the MLC memory cell is being read. In this example, the read disturb influencing the MLC memory cell M most seriously will be described in order to prove that this embodiment can improve the problem of the read disturb significantly. Referring to FIGS. 6 and 2, it is assumed that a left half cell 110 of the MLC memory cell M in FIG. 6 is in the threshold voltage state {01}, a right half cell 120 thereof (as shown by oblique line) is in the threshold voltage state {11}, and the operation of reading the left half cell 110 is described as an example.

In the conventional read operation, when the left half cell pertaining to the threshold voltage state {01} is read, the word line voltage controller 510 provides at least one of the word line voltages VG1 to VG3, and the bit line voltage controller 520 provides a constant bit line voltage VBL' so that the operation of reading the left half cell 110 is achieved. However, when the reading circuit 500 provides the word line voltage VG1 and the bit line voltage VBL' simultaneously, the right half cell 120 is slightly programmed so that the data content stored therein may be changed because the word line voltage VG1 has the relatively high level (e.g., VG1=5V and VBL'=1.6 V).

In this embodiment, the phenomenon of the read disturb is eased by decreasing the bit line voltage applied to the drain D of the MLC memory cell M. That is, the bit line voltage controller 520 provides the bit line voltage VBL1 (VBL1<VBL') having the relatively lower level, such as 1.4 volts, so as to decrease the hot carrier injection during the read operation. Therefore, when the reading circuit 500 provides the word line voltage VG1 and the bit line voltage VBL1 in this example, the hot carrier that injected to right half cell is decreased. So, it is possible to prevent the charges stored in the right half cell 120 from being influenced and the phenomenon of the read disturb can be eased.

However, when the level of the bit line voltage is reduced in order to solve the problem of the read disturb, the problem of the second bit effect may rise. In this invention, it was found that the read disturb usually occurs when the high word line voltage is provided, and the second bit effect usually occurs when the low word line voltage is provided. The read disturb may be eased by decreasing the bit line voltage, and the second bit effect may be avoided by increasing the bit line voltage. Therefore, the reading circuit of this embodiment correspondingly provides bit line voltages with different levels according to the level of the word line voltage in order to ease the problem induced by the second bit effect while the phenomenon of the read disturb is eased.

For example, when the left half cell 110 is being read with the left half cell 110 being kept in the threshold voltage state {01} and the right half cell being kept in the threshold voltage state {11}, the read disturb becomes most serious. At this time and when the word line voltage controller 510 provides the word line voltage VG1 (VG1>VG2>VG3) with the relatively higher level, the bit line voltage controller 520 correspondingly provides the bit line voltage VBL1 (VBL1<VBL2<VBL3) with the relatively lower level. Because the lower bit line voltage VBL1 significantly differs from the voltage for programming the other half cell, the problem of the read disturb can be improved.

Correspondingly, when the left half cell 110 is being read with the left half cell 110 being kept in the threshold voltage state {11} and the right half cell being kept in the threshold voltage state {01}, the second bit effect becomes most serious. At this time and when the word line voltage controller 510 provides the word line voltage VG3 (VG1>VG2>VG3)

with the relatively lower level, the bit line voltage controller 520 correspondingly provides the bit line voltage VBL3 (VBL1<VBL2<VBL3) with the relatively high level to ease the problem of the second bit effect.

At this time, when the left half cell 110 is being read, a channel length of the left half cell 110 is influenced by the amount of charges trapped by the right half cell 120. In addition, the higher bit line voltage makes the channel to be farther from the right half cell 120 so that the influence of the trapped charges of the right half cell 120 on the left half cell 110 is reduced. Therefore, this embodiment provides the higher bit line voltage when the lower word line voltage is provided in order to ease the second bit effect effectively.

Consequently, when the reading circuit using the reading method for the MLC memory of this embodiment is performing a read operation, the read disturb can be effectively eased, and the problem of the second bit effect can be improved by providing the corresponding word line voltage and the corresponding bit line voltage.

Second Embodiment

Figure 7:
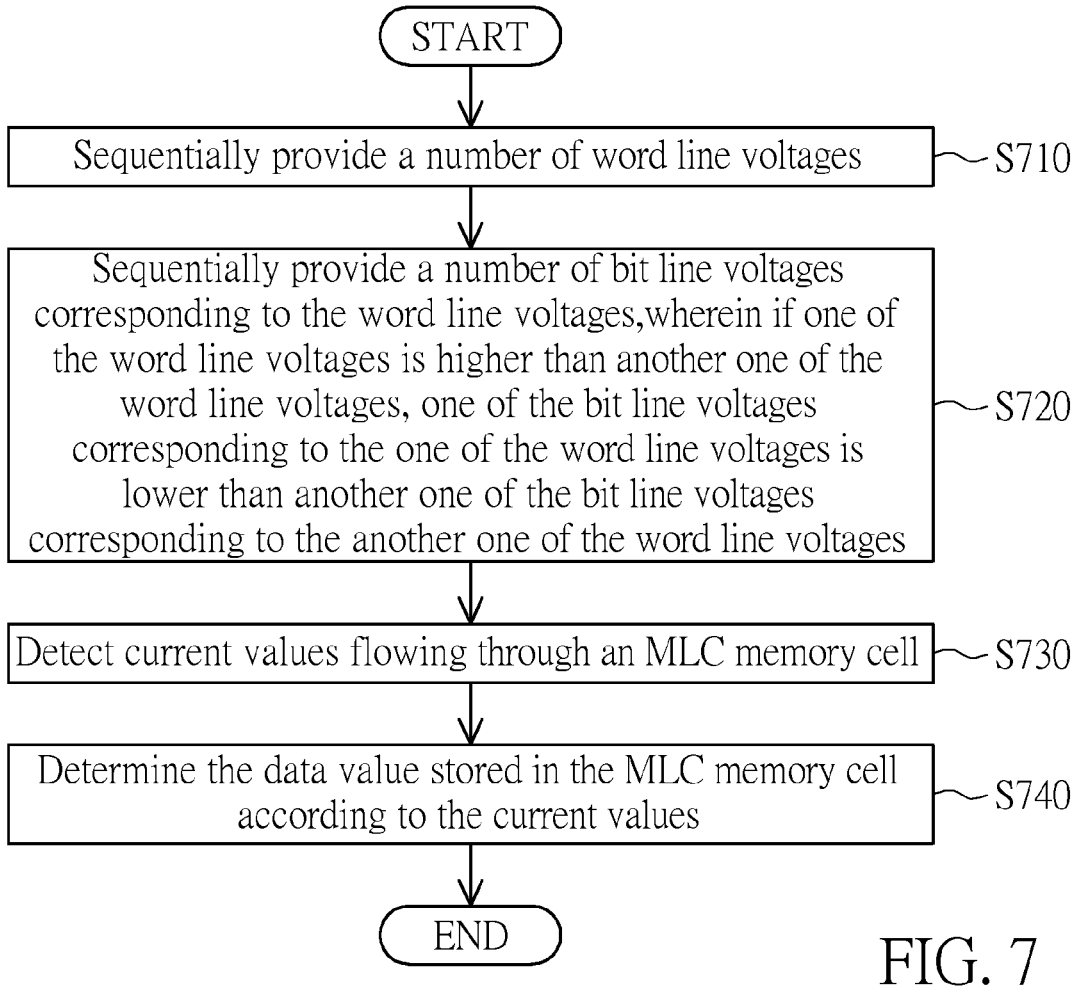
FIG. 7 is a flow chart showing a reading method for an MLC memory according to a second embodiment of the invention.

FIG. 7 is a flow chart showing a reading method for an MLC memory according to a second embodiment of the invention. Referring to FIG. 7, the method includes the following steps. In step S710, a number of word line voltages are sequentially provided. In step S720, a number of bit line voltages corresponding to the word line voltages are sequentially provided, wherein if one of the word line voltages is higher than another one of the word line voltages, one of the bit line voltages corresponding to the one of the word line voltages is lower than another one of the bit line voltages corresponding to the another one of the word line voltages. In an exemplary embodiment, each of the word line voltages and its corresponding bit line voltage are provided simultaneously. In step S730, current values flowing through the MLC memory cell are detected. In step S740, the data value stored in the MLC memory cell is determined according to the current values. Each current value is the value of the current flowing through the MLC memory cell when the corresponding word line voltage and the corresponding bit line voltage are provided to the MLC memory cell.

Figure 8:
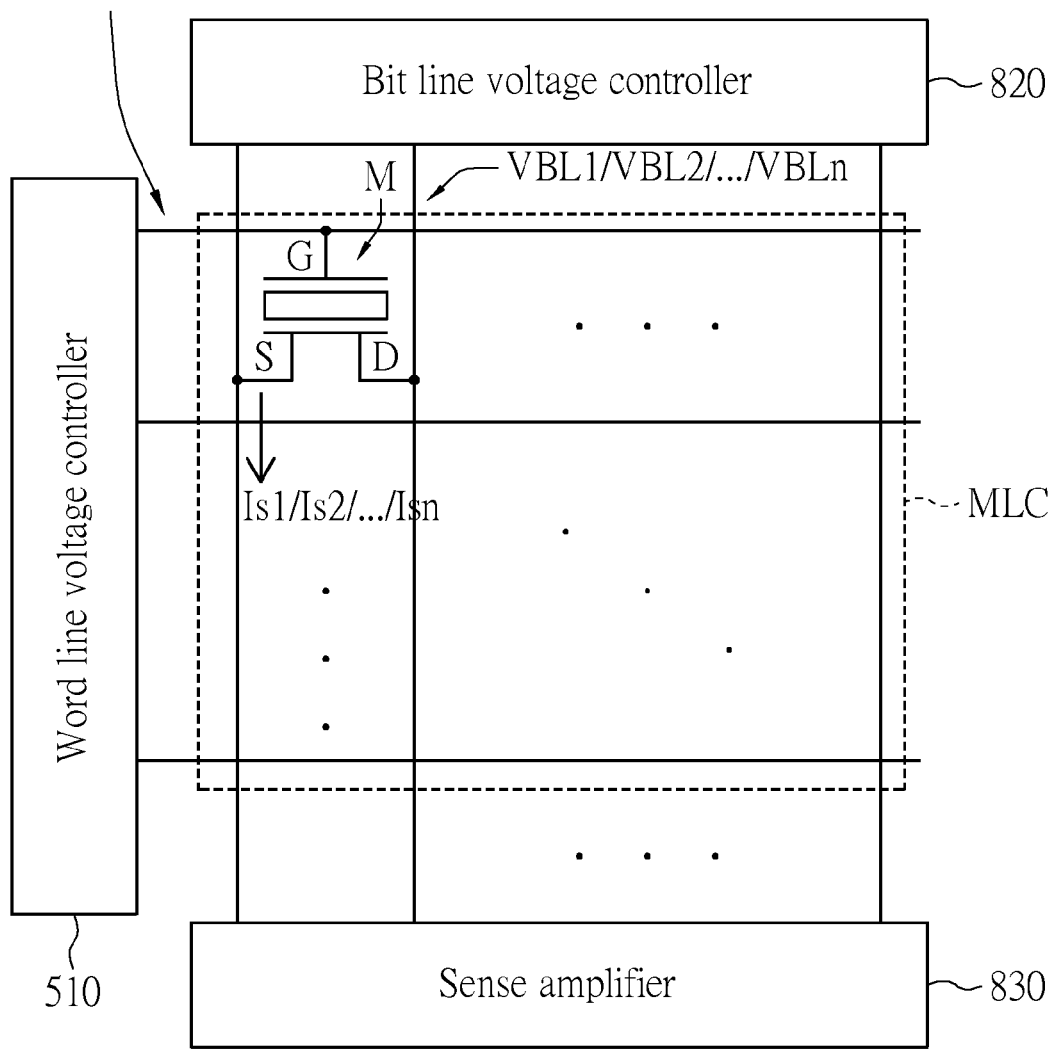
FIG. 8 is a schematic illustration showing a reading circuit using the reading method for the MLC memory according to the second embodiment of the invention.

FIG. 8 is a schematic illustration showing a reading circuit 800 using the reading method for the MLC memory according to the second embodiment of the invention. Referring to FIG. 8, the reading circuit 800 includes a word line voltage controller 810, a bit line voltage controller 820 and a sense amplifier 830. In this embodiment, the word line voltage controller 810 provides a number of word line voltages VG1 to VGn, and the bit line voltage controller 820 provides a number of bit line voltages VBL1 to VBLn corresponding to the word line voltages. Each of the word line voltages VG1 to VGn and the corresponding one of the bit line voltages VBL1 to VBLn are provided simultaneously. For example, the word line voltage VG1 and its corresponding bit line voltage VBL1 are provided simultaneously; the word line voltage VG2 and its corresponding bit line voltage VBL2 are provided simultaneously; analogically, the word line voltage VGn and its corresponding bit line voltage VBLn are provided simultaneously.

If One of the word line voltages VG1 to VGn is higher than another one of the word line voltages VG1 to VGn, one of the bit line voltages VBL1 to VBLn corresponding to the one of the word line voltages VG1 to VGn is lower than another one of the bit line voltages VBL1 to VBLn corresponding to the another one of the word line voltages VG1 to VGn. For example, the word line voltage VG1 is higher than the word line voltage VG2, and the corresponding bit line voltage VBL1 is lower than the corresponding bit line voltage VBL2; the word line voltage VG2 is higher than the word line voltage VG3, and the corresponding bit line voltage VBL2 is lower than the corresponding bit line voltage VBL3. Analogically, the relationship among the word line voltages VG1 to VGn is preferably VG1>VG2>. . . >VGi>VGn (i<n), and the relationship among the corresponding bit line voltages VBL1 to VBLn is VBL1<VBL2<VBLi<. . . <VBLn (i<n).

The sense amplifier 830 detects multiple current values Is1 to Isn flowing through the MLC memory cell M, and determines the data values stored in the MLC memory cell M according to these current values Is1 to Isn. Each of the current value Is1 to Isn is the value of the current flowing through the MLC memory cell M when the corresponding one of the word line voltages VG1 to VGn and the corresponding one of the bit line voltages VBL1 to VBLn are provided to the MLC memory cell M. In practice, the word line voltage is applied to the gate G of the MLC memory cell M, the corresponding bit line voltage is applied to the drain D of the MLC memory cell M, and the current flows through the source S of the MLC memory cell M.

Similarly, when the reading circuit using the reading method for the MLC memory of this embodiment is performing a read operation, the read disturb can be effectively eased, and the problem of the second bit effect can be improved by providing the corresponding word line voltage and the corresponding bit line voltage. Furthermore, compared with the first embodiment, the reading method for the MLC memory of the second embodiment may further be applied to the MLC memory cell which stores more than two bits of data. For example, if the one half cell of MLC memory cell can store three bits of data, the word line voltage controller provides seven different word line voltages to perform the read operation.

The reading method for the MLC memory and the reading circuit using the same according to each embodiment of the invention may be applied to the MLC memory having, without limitation to, a structure of silicon-oxide-nitride-oxide-silicon (SONOS), or having a structure of floating gate. Although the MLC memory with the floating gate structure is free from the problem of the second bit effect, the phenomenon of the read disturb still can be effectively eased when the invention is applied. The reading method for the MLC memory according to the invention may be adopted as long as each memory cell of the MLC memory has multiple bits.

In the reading method for the MLC memory and the reading circuit using the same according to the embodiments of the invention, the read disturb generated when the MLC memory cell is being read can be eased, the second bit effect can be improved to avoid the read error, and the read correctness can be enhanced.

While the invention has been described by way of example and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A reading method for a multi-level cell (MLC) memory, the method comprising the steps of:
providing a first word line voltage and a first bit line voltage simultaneously to a selected cell; and
providing a second word line voltage and a second bit line voltage simultaneously to the selected cell;

wherein the first word line voltage is lower than the second word line voltage, and the first bit line voltage is higher than the second bit line voltage.

2. The method according to claim 1, further comprising the steps of:

detecting a first current flowing through the selected cell when the first word line voltage and the first bit line voltage are provided to the selected cell;

detecting a second current flowing through the selected cell when the second word line voltage and the second bit line voltage are provided to the selected cell; and determining data value stored in the selected cell according to the first current and the second current.

3. The method according to claim 2, further comprising the steps of:

providing a third word line voltage and a third bit line voltage simultaneously to the selected cell;

detecting a third current flowing through the selected cell when the third word line voltage and the third bit line voltage are provided to the selected cell; and determining the data value stored in the selected cell according to the first current, the second current and the third current, wherein the second word line voltage is lower than the third word line voltage, and the second bit line voltage is higher than the third bit line voltage.

4. A reading circuit applied to a multi-level cell (MLC) memory, the circuit comprising;

a word line voltage controller for providing a plurality of word line voltages; and a bit line voltage controller for providing a plurality of bit line voltages corresponding to the word line voltages;

wherein a first word line voltage of the word line voltages and a first bit line voltage of the bit line voltages are applied to a selected cell in a first period, a second word line voltage of the word line voltages and a second bit line voltage of the bit line voltages are applied to the selected cell in a second period, the first word line voltage is lower than the second word line voltage, and the first bit line voltage is higher than the second bit line voltage.

* * * * *